(12) United States Patent
Scherler

(10) Patent No.: US 11,516,946 B2
(45) Date of Patent: Nov. 29, 2022

(54) GENERATOR

(71) Applicant: COMET AG, Flamatt (CH)

(72) Inventor: Andreas Scherler, Worb (CH)

(73) Assignee: COMET AG, Flamatt (CH)

( * ) Notice: Subject to any disclaimer, the term of this patent is extended or adjusted under 35 U.S.C. 154(b) by 307 days.

(21) Appl. No.: 16/879,942

(22) Filed: May 21, 2020

(65) Prior Publication Data

US 2020/0375068 A1 Nov. 26, 2020

(30) Foreign Application Priority Data

May 22, 2019 (GB) ..................................... 1907195

(51) Int. Cl.
*H05K 7/20* (2006.01)
*H03F 1/30* (2006.01)
*H03F 3/213* (2006.01)

(52) U.S. Cl.
CPC ......... *H05K 7/20909* (2013.01); *H03F 1/301* (2013.01); *H03F 3/213* (2013.01); *H05K 7/20145* (2013.01); *H05K 7/20154* (2013.01); *H05K 7/20172* (2013.01); *H03F 2200/451* (2013.01)

(58) Field of Classification Search
CPC . H02K 11/33; H02K 9/00; H02K 9/04; H02K 5/207; H02K 5/20; H02M 1/08; H05K 7/20145; H05K 7/20154; H05K 7/20909; H05K 7/20518; H05K 7/2089
USPC ....... 361/695, 697, 690, 679.5, 694, 679.49; 165/80.2, 80.3, 104.33; 454/75, 184
See application file for complete search history.

(56) References Cited

U.S. PATENT DOCUMENTS

| | | | |
|---|---|---|---|
| 3,970,898 A * | 7/1976 | Baumann | H02H 7/262 361/68 |
| 4,237,521 A | 12/1980 | Denker | |
| 5,424,915 A | 6/1995 | Katooka et al. | |
| 5,689,403 A * | 11/1997 | Robertson, Jr. | H04B 1/036 415/128 |
| 6,435,267 B1 | 8/2002 | Sterner | |
| 7,274,569 B2 | 9/2007 | Sonoda | |
| 8,611,088 B2 * | 12/2013 | Barna | H05K 7/20918 165/122 |
| 10,165,711 B2 | 12/2018 | Pallasmaa et al. | |
| 2005/0259403 A1 | 11/2005 | Sonoda | |
| 2013/0050939 A1 | 2/2013 | Burke et al. | |
| 2016/0128229 A1 | 5/2016 | Pallasmaa et al. | |
| 2017/0202106 A1 * | 7/2017 | Bhutta | H01J 37/32935 |
| 2019/0201073 A1 * | 7/2019 | Nott | A61B 90/37 |

FOREIGN PATENT DOCUMENTS

| | | |
|---|---|---|
| CN | 201160255 Y | 12/2008 |
| CN | 203674965 U | 6/2014 |
| EP | 0356991 B1 | 3/1990 |
| WO | 2013032989 A1 | 3/2013 |

* cited by examiner

*Primary Examiner* — Mandeep S Buttar
(74) *Attorney, Agent, or Firm* — The Webb Law Firm

(57) ABSTRACT

Provided is a generator that includes a housing, a high-power circuit including a power amplifier, and a low-power circuit. An air flow guidance plate divides the housing into at least two compartments including a high-power compartment and a low-power compartment. The high-power circuit is disposed within the high-power compartment and the low-power circuit is disposed within the low-power compartment.

14 Claims, 8 Drawing Sheets

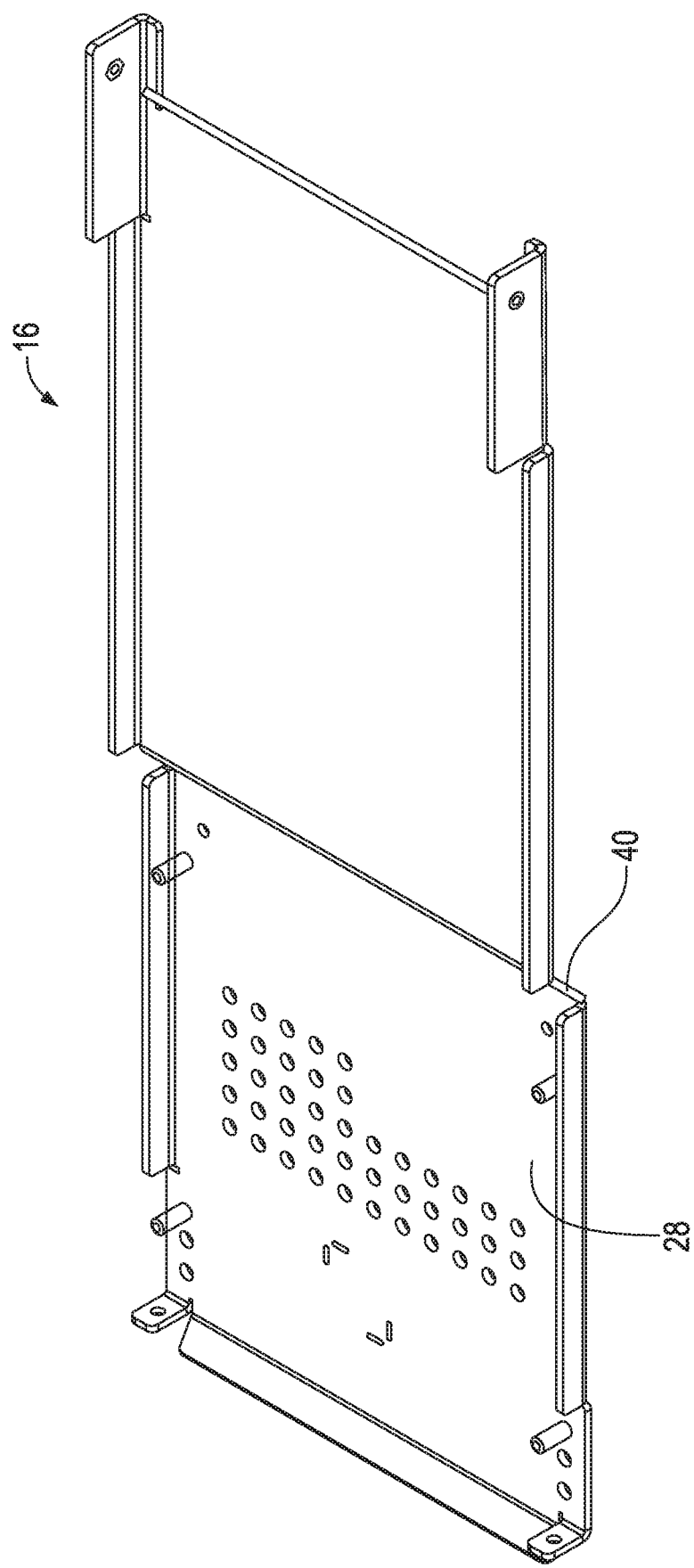

GENERATOR

CROSS-REFERENCE TO RELATED APPLICATION

This claims priority to United Kingdom Patent Application No. 1907195.0 filed May 22, 2019, the disclosure of which is hereby incorporated by reference in its entirety.

BACKGROUND OF THE INVENTION

Field of the Invention

The present disclosure generally relates to a generator, particularly a radiofrequency generator.

Description of Related Art

Generators, particularly radiofrequency (RF) generators, are useful for providing output power in a variety of applications including plasma tools, fabrication of semiconductors (e.g. deposition, etching and modification of thin films), medical devices (e.g. electrosurgical devices and medical imaging machines such as magnetic resonance imaging, MRI, machines), food packaging, commercial surface modifications and coatings. Many other applications exist for generators for producing alternating current.

Generally, generators include relatively low-power control circuitry for providing control signals to one or more high-power amplifier circuits. The control signals control one or more transistors of the high-power amplifier circuit to produce an alternating current output power at a set frequency and power. The low-power control circuitry can be sensitive to electromagnetic interference (EMI) from the high-power circuit. Further, it is often required to provide separate cooling circuits for both the high-power amplifier circuit and the lower power control circuitry, which can prove problematic when lower size generator designs are sought.

Accordingly, it is desirable to provide a generator that is relatively compact and able to shield low-power circuitry from high-power circuitry. Further, it is desirable to provide a generator that has an effective cooling system for both low-power and high-power circuits, where the cooling system is relatively low in complexity, size and/or cost. Furthermore, other desirable features and characteristics of the present invention will become apparent from the subsequent detailed description of the invention and the appended claims, taken in conjunction with the accompanying drawings and the background of the invention.

SUMMARY OF THE INVENTION

In one aspect, a generator is provided that includes a housing, a high-power circuit including a power amplifier, a low-power circuit, and a cooling air duct dividing the housing into at least two compartments including a high-power compartment and a low-power compartment. The high-power circuit is disposed within the high-power compartment and the low-power circuit is disposed within the low-power compartment.

The cooling air duct is able to shield the low-power circuit from EMI from the high-power circuit and also to cool both circuits, whilst ensuring a compact generator arrangement.

Preferably, the low-power circuit comprises a control circuit for generating control signals for controlling at least one transistor of the power amplifier. Preferably, the control signals are configured to control DC input voltage to the at least one transistor and/or an input signal having a set frequency. Preferably, the control signals are gate signals.

Preferably, the control circuit includes a processor configured to receive measurement signals of output power of the generator, to determine error in measurement signals relative to desired values (e.g. as set through a control circuit interface described below) and to output responsive control signals for reducing the error. Preferably, the control circuit includes an analog to digital converter for digitizing measurement signals of output power. Preferably, the control circuit includes interfaces for controlling the generator including power settings. The interfaces include interfaces for display settings and power settings, in some embodiments.

Preferably, the cooling air duct comprises an air flow guidance plate.

Preferably, the air flow guidance plate comprises a distribution of cooling air holes allowing cooling air to pass from the low-power compartment to the cooling air duct. The air flow guidance plate is thus configured to control air flow between the cooling air duct and the low-power compartment through, at least in part, size and number of the distribution of cooling air holes. Preferably, the distribution of cooling air holes is located over the low-power circuit.

Preferably, the generator comprises a fan inlet at one end of the housing and a cooling air outlet at an opposed end of the housing, wherein cooling air passes from the fan inlet to the cooling air outlet through the cooling air duct.

Preferably, the generator comprises a fan located adjacent the fan inlet at the one end of the housing. Preferably, the fan is bidirectional or unidirectional.

Preferably, the air flow guidance plate comprises a distribution of cooling air holes allowing cooling air to pass between the cooling air duct and the low-power compartment to cool the low-power circuit. Preferably, the distribution of cooling air holes is configured such that air passes therethrough by venturi effect. Preferably, the fan inlet, the cooling air outlet and the air flow guidance plate are configured and arranged such that cooling air passes from the fan inlet and out through the cooling air outlet and cooling air pass through the distribution of cooling air holes in a substantially perpendicular direction relative to the remainder of the flow of cooling air to enter the cooling air duct from the low-power compartment for cooling the low-power circuit.

Preferably, the air flow guidance plate is shaped to reduce a cross-sectional area of the cooling air duct adjacent to the cooling air outlet, thereby forming a higher cross-sectional area region and a reduced cross-sectional area region of the cooling air duct, wherein the distribution of cooling air holes is located in the reduced cross-sectional area region. Preferably, the higher cross-sectional area region is located toward a fan and the reduced cross-sectional area region is located toward a cooling air inlet/outlet. Preferably, the air flow guidance plate includes a kink therein that separates the higher cross-sectional area region and the reduced cross-sectional area region.

Preferably, the generator comprises a heat sink upon which the high-power circuit is disposed, wherein the heat sink includes cooling fins. Preferably, the heat sink defines part of the cooling air duct. That is, the heat sink separates the high-power compartment and the cooling air duct, whilst the air flow guidance plate separates the low-power compartment and the cooling air duct. Preferably, the heat sink is made of metal. Preferably, the heat sink has deeper extending cooling fins in the higher cross-sectional area region and shallower extending cooling fins in the reduced cross-sectional area region. Preferably, the deeper extending cooling fins extend fittingly to the air flow guidance plate whereas the shallower extending cooling fins are more spaced from the air flow guidance plate.

Preferably, the generator includes a front panel and a back panel and the cooling fins extend along the heat sink from the front panel to the back panel.

Preferably, the generator includes a fan inlet at one end of the housing and a cooling air outlet at an opposed end of the housing, such that cooling air passes through the cooling air duct from the fan inlet to the cooling air outlet over the cooling fins. Preferably, the generator is configured such that cooling air passes from the fan inlet to the cooling air outlet along the air flow guidance plate and cooling air passes through a distribution of cooling air holes passing through the air flow guidance plate by venturi effect to join the stream of cooling air in the cooling air duct.

Preferably, the cooling air duct is between the heat sink and the air flow guidance plate having a fan at one end adjacent a cooling air inlet/outlet (depending on which direction the fan is operated) and a cooling air inlet/outlet at the other end such that cooling air passes from the cooling air inlet/outlet at one end to the cooling air inlet/outlet at the other end and cooling air passes through the air flow guidance plate (optionally through a distribution of cooling air holes therein) from the low-power compartment to join the flow of cooling air in the cooling air duct. Preferably, the cooling air duct reduces in cross-section area toward the cooling air inlet/outlet at the other end in a reduced cross-section area region such that cooling air passes into the reduced cross-section area region before being joined by cooling air passing through the air flow guidance plate. Preferably, the power amplifier is disposed toward one end of the generator relative to the low-power circuit being disposed toward the other end of the generator.

Preferably, the housing is rectangular cuboid shaped defining four relatively large faces and two relatively small faces. The housing comprises front and back panels located, respectively, at the two relatively small faces of the housing. Preferably, the air flow guidance plate extends between the front and back panels and spans, at least partly, two opposed faces of the relatively large faces of the housing.

Preferably, the air flow guidance plate is made of metal.

Preferably, the cooling air duct is made of metal.

Preferably, the power amplifier is configured for outputting radiofrequency, RF, power. Preferably, the power amplifier has an operating frequency in the range of 100 kHz to 200 MHz. Preferably, the power amplifier has an output power of at least 100 W. Preferably, the power amplifier comprises at least two field effect transistors connected in a push-pull arrangement.

Preferably, the low-power circuit comprises a memory and a processor (such as an FPGA). Preferably, the processor is configured to receive measurement values concerning power output from the generator and to execute a control scheme that is responsive to the measurement values to generate control signals for adjusting input parameters of the power amplifier (such as DC input and/or phase and/or amplitude of an input signal).

BRIEF DESCRIPTION OF THE DRAWINGS

The present invention will hereinafter be described in conjunction with the following drawing figures, wherein like numerals denote like elements.

FIG. 8 is a view from below of an air flow guidance plate including a distribution of cooling holes, in accordance with various embodiments of the present disclosure.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Figure 1:
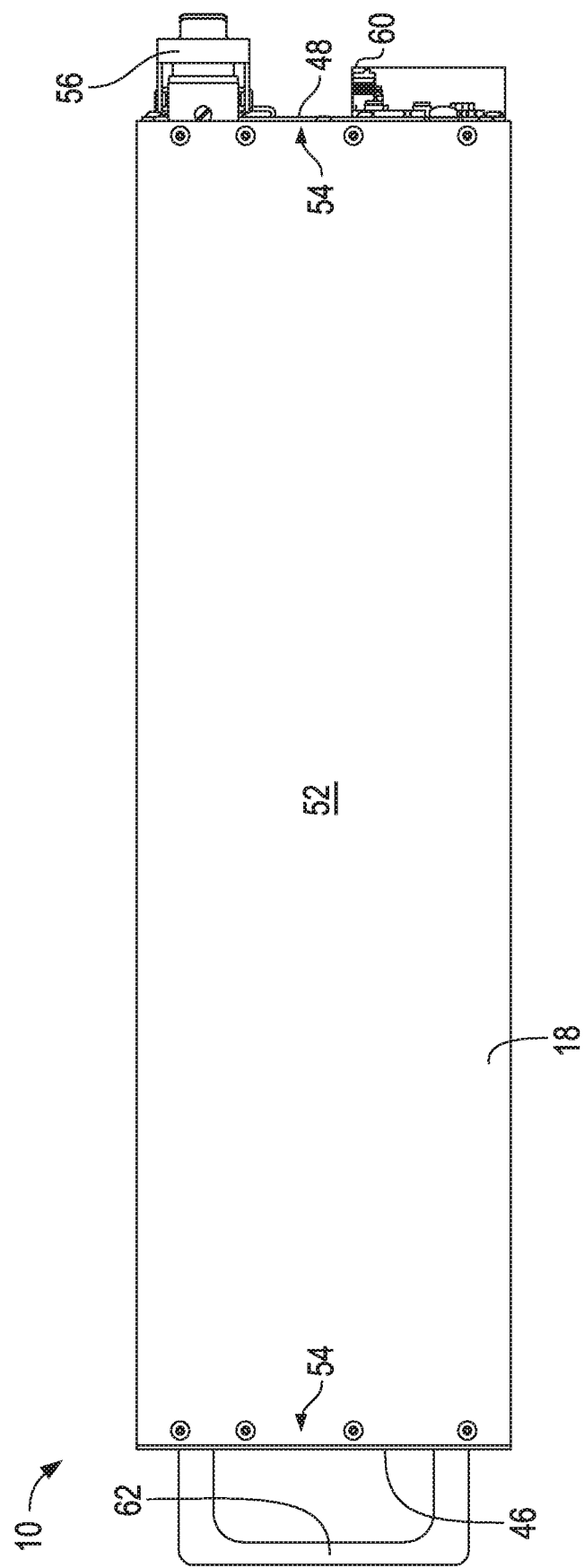
FIG. 1 is a side view of a generator, in accordance with various embodiments of the present disclosure.

FIG. 1 is a side view of a generator, in accordance with various embodiments of the present disclosure. The generator includes a housing 18 formed by bending a sheet of metal into a cuboid shaped sleeve and mounting a front panel 46 at one open end of the sleeve and a back panel 48 at the other open end of the sleeve to form a closed box shaped housing. The housing 18 is formed of materials for shielding internal electronic components of the generator 10 from EMI. The sleeve of the housing 18 forms relatively large faces 52 thereof, whilst the front panel 46 and the back panel 48 are located at, and define, relatively small faces 54 of the housing 18.

Figure 4:
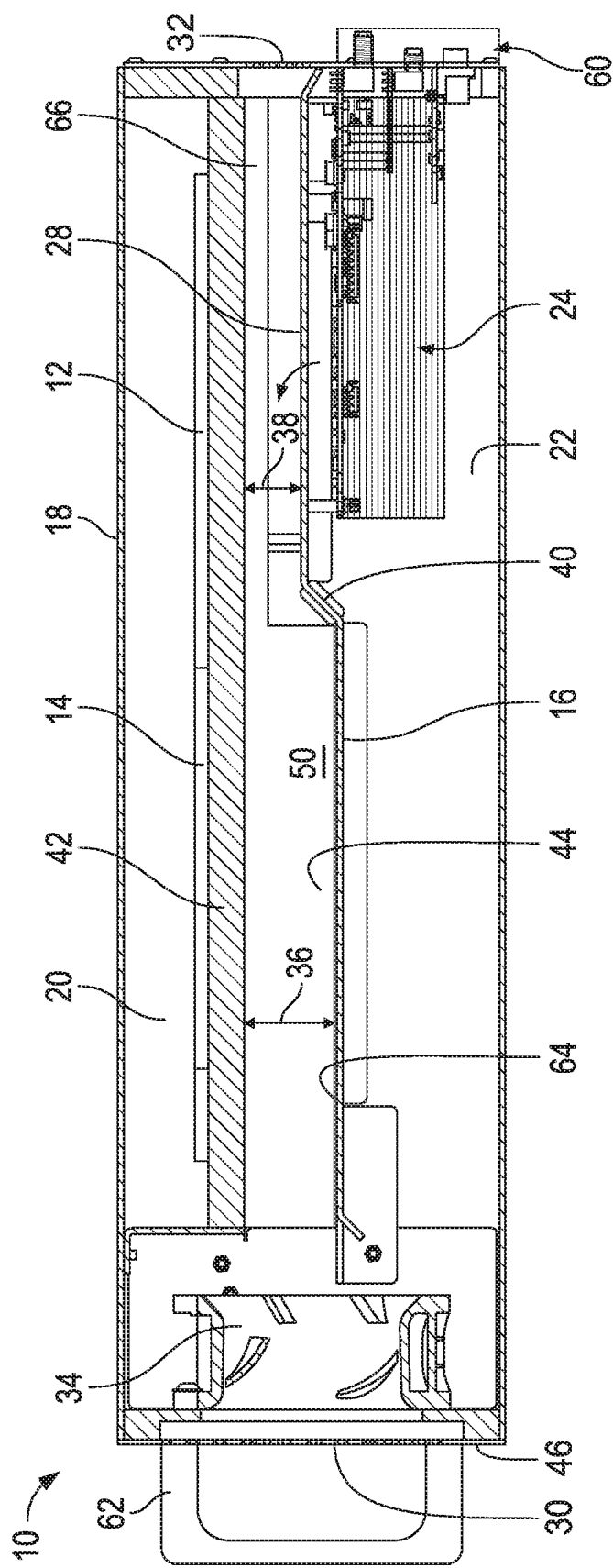
FIG. 4 is a side cross-section of the generator of FIG. 1 showing a fan, heat sink and air flow guidance plate disposed therein, in accordance with various embodiments of the present disclosure.

FIG. 4 is a side cross-section of the generator of FIG. 1, in accordance with various embodiments of the present disclosure. The generator 10 includes an air flow guidance plate 16 defining part of a cooling air duct 50 that divides the housing 18 into a high-power compartment 20 and a low-power compartment 22. The air flow guidance plate 16 is, preferably, made of sheet metal and extends at least partly between opposed faces 52 of the housing 18, thereby providing an EMI shielding function between the high and lower power compartments 20, 22.

Figure 5:
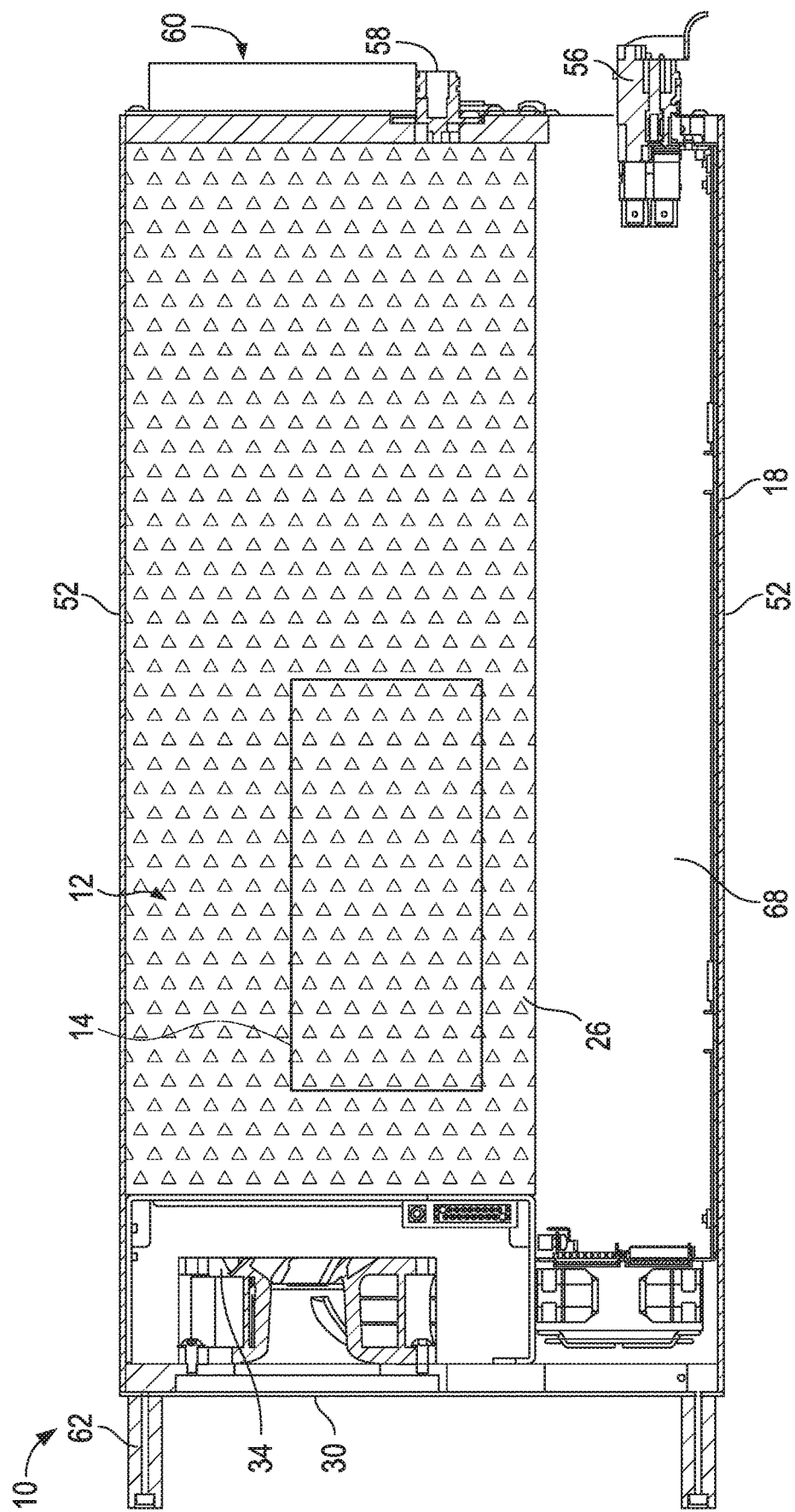
FIG. 5 is a top cross-section of the generator of FIG. 1 showing a high-power circuit including a power amplifier and disposed within a high-power compartment, in accordance with various embodiments of the present disclosure.

The high-power compartment 20 is shown in greater detail in the top cross-sectional view of FIG. 5. The high-power compartment 20 includes a high-power circuit 12 including a power amplifier 14. The power amplifier 14 includes at least one transistor 26 (circuit shown schematically). In the exemplary embodiments, the power amplifier 14 includes first and second transistors 26 connected in a push pull arrangement. Preferably, the high-power circuit 12 includes a power transformer, as part of an output network, connected to the output (e.g. drains) of the at least one transistor 26. The high-power circuit 12 is configured to output amplifier output power through a power output connector 58 of the generator 10. Preferably, the high-power circuit 12 includes a combiner for combining outputs from the first and second transistors 26. The high-power circuit 12 includes a sampler, such as a directional coupler, for providing measurement signals of output power of the generator.

Referring to FIG. 4, the low-power compartment 22 includes a low-power circuit 24 configured to provide control signals for the power amplifier 14. The low-power circuit 24 includes a processor configured to receive digitized versions of the measurement signals from the sampler of amplified power output from the power amplifier 14 (such as voltage and current measurements). Thus, preferably, the low power circuit includes an analog to digital converter for digitizing measurement signals received from the sampler. The lower power circuit 24 is configured to process the measurement signals according to a control scheme to generate control signals for adjusting parameters of the power amplifier 14. The control signals include phase and amplitude of an input signal (e.g. a gate signal) to the at least one transistor 26 and/or a DC input signal thereto. Preferably, the control signals generated in the low-power circuit 24 are provided to a pre-amplifier of the high-power circuit 12 for generating an RF signal that is amplified through the at least one transistor 26. The control signals thus control output of the power amplifier. The control signals are generated via the processor in order to minimize an error between the digitized measurement signals and a set point. The set point can be set through interface 60 (shown schematically) of the low-power circuit 24.

The high-power circuit 12, particularly the transistors 26, requires active cooling to a significantly greater extent than the low-power circuit 24. In accordance with an aspect of the present disclosure, cooling air flow passes, in major part, within a cooling air duct 50 dividing the high-power compartment 20 and the low power compartment 22 to cool the high-power circuit 12. Cooling air passes through a distribution of cooling air holes 28 from the low-power compartment 22 into the cooling air duct 50 to cool the low-power circuit 24.

Figure 7:
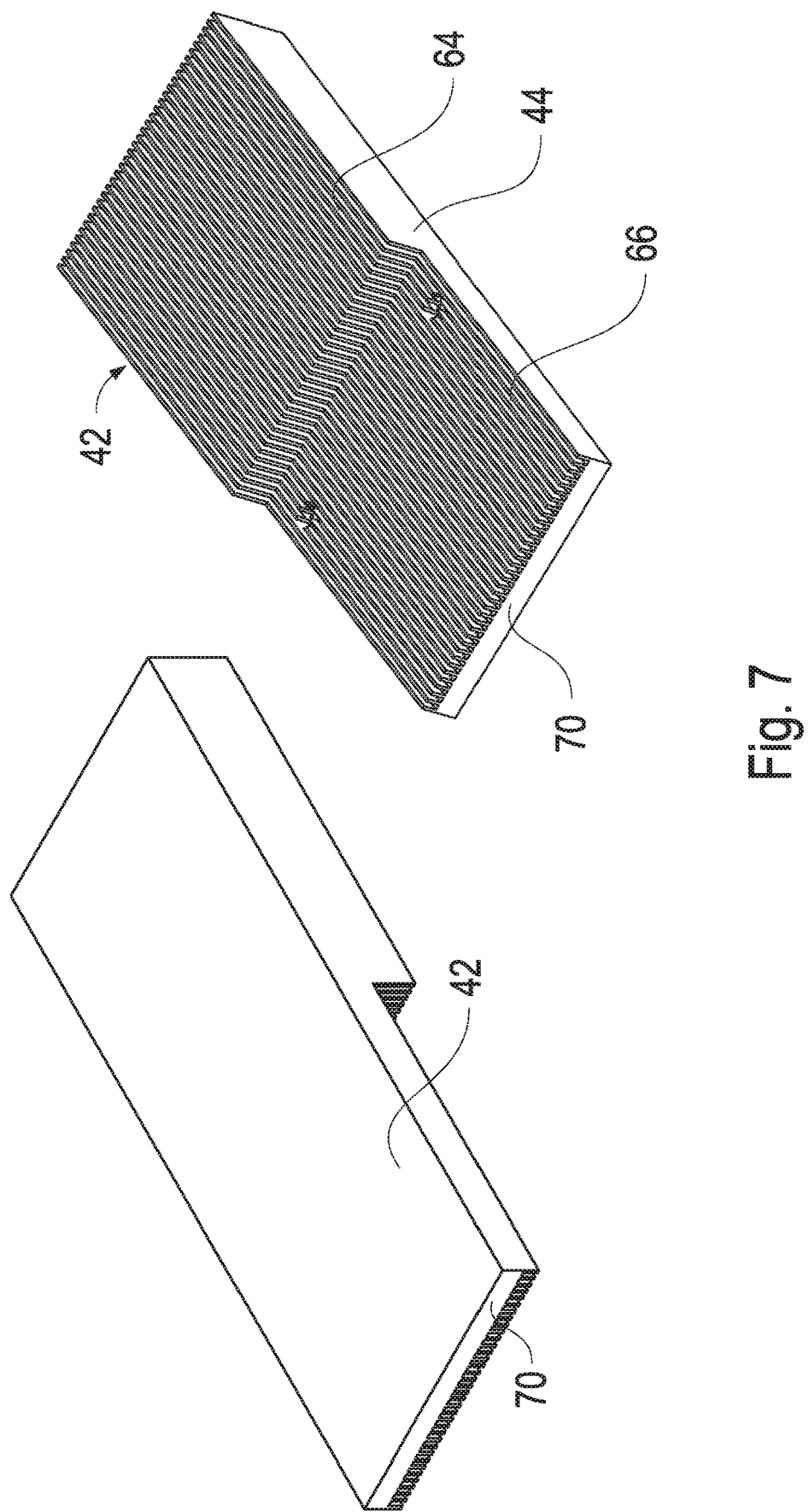
FIG. 7 is views from above and below of a heat sink including cooling fins of the generator of FIG. 1, in accordance with various embodiments of the present disclosure.

Referring again to FIG. 4, the generator 10 includes a heat sink 42 extending at least partly between the same opposed faces as the air flow guidance plate 16. The heat sink 42 has the high-power circuit 12 mounted thereon and is operative to draw heat away from the high-power circuit 12, particularly the at least one transistor 26. The heat sink 42 can be described as being located above the air flow guidance plate 16. The high-power circuit 12 is located on a top side of the heat sink 42. The low-power circuit 24 is mounted on an underside of the air flow guidance plate 16. A duct 50 is defined between the air flow guidance plate 16 and the heat sink 42 through which the cooling air passes. The heat sink 42 includes cooling fins 44 projecting from an underside of a solid base portion 70 thereof, as shown in FIG. 7. The high-power circuit 12 is disposed upon the base portion 70 of the heat sink 42.

In accordance with the exemplary embodiment, the duct 50 is such as to have a reducing cross-sectional area from a higher cross-sectional area region 36 at one end of the high-power compartment 20 adjacent the power amplifier 14 to a reduced cross-sectional area region 38 at an opposed end of the high-power compartment 20 adjacent the low-power circuit 24. The reducing cross-sectional area of the duct 50 is constructed by reducing a spacing between an underside of the base portion 70 (see FIG. 7) of the heat sink 42 and an upper side of the air flow guidance plate 16. Preferably, as can also be seen in FIG. 8, the air flow guidance plate 16 includes a kink 40 such that part of the air flow guidance plate 16 on one side of the kink 40 is spaced farther away from the base portion 70 of the heat sink 42 and part of the air flow guidance plate 16 on the other side of the kink 40 is spaced closer to the air flow guidance plate 16, thereby respectively forming the higher cross-sectional area region 36 and the reduced cross-sectional area region 38.

In accordance with various embodiments, and as illustrated in FIGS. 4 and 7, the heat sink 42 includes deeper cooling fins 64 that project relatively far from the base portion 70 and shallower cooling fins 66 that do not project as far from the base portion 70. The deeper cooling fins 64 are disposed in the higher cross-sectional area region 36 and the shallower cooling fins 66 are disposed in the reduced cross-sectional area region 38. The shallower cooling fins 66 represent a reduced cooling requirement upstream of cooling air flow as the power amplifier 14, and associated transistors 26, are located downstream of the cooling air flow adjacent to the deeper cooling fins 64.

Figure 2:
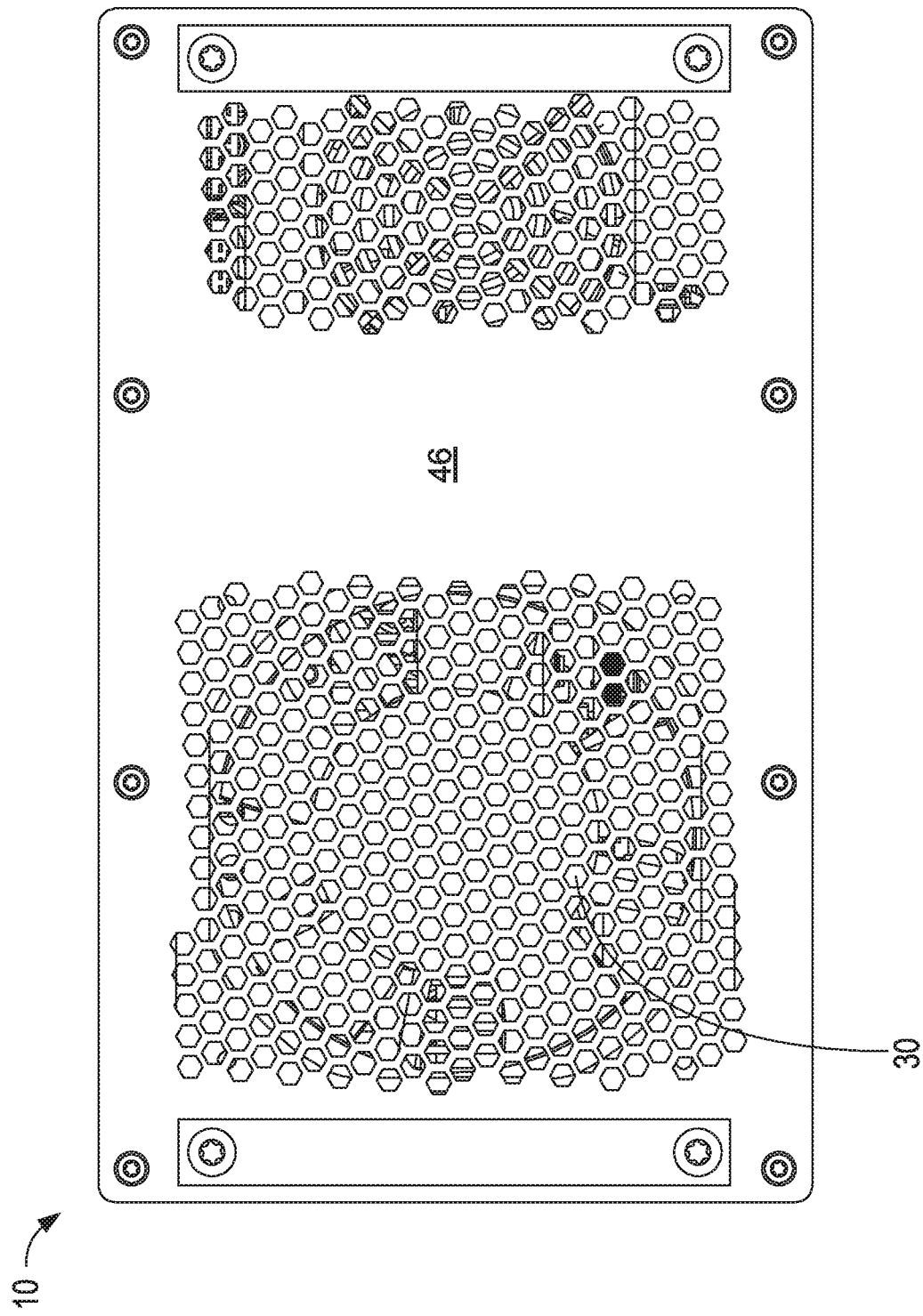
FIG. 2 is a front view of the generator of FIG. 1 illustrating a front panel thereof, in accordance with various embodiments of the present disclosure.
Figure 3:
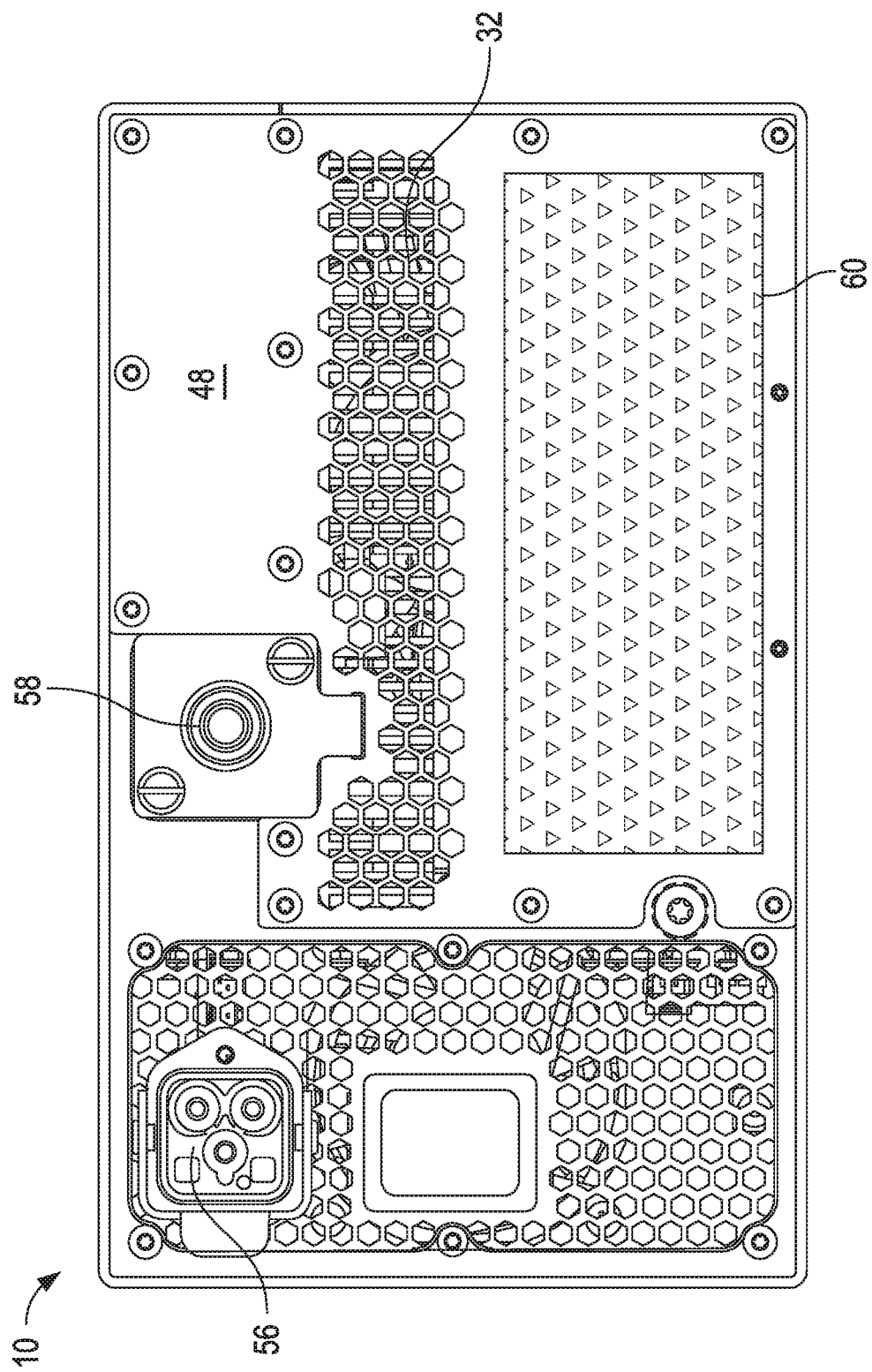
FIG. 3 is a back view of the generator of FIG. 1 showing a back panel thereof, in accordance with various embodiments of the present disclosure.

In accordance with various embodiments, and continuing to refer to FIG. 4, a fan 34 is disposed adjacent the front panel 46. The front panel 46 is shown from a front view of the generator 10 in FIG. 2. The fan can operate in either direction (it can be bidirectional). The front panel 46 includes a fan inlet/outlet 30 comprising holes through the front panel through which air can be sucked into/expelled from the housing 18 of the generator 10 by operation of the fan 34. As can be seen in FIGS. 1 and 4, the front panel 46 has a handle 62 allowing the generator to be conveniently transported. With reference to FIG. 3, in the exemplary embodiment, the back panel 48, which is mounted at an opposite end of the housing 18 to the front panel 46, has a cooling air inlet/outlet 32, which includes holes through the back panel 48 allowing air to be expelled from/sucked into the housing 18 of the generator 10 by operation of the fan 34. The back panel 48 further includes the power output connector 58 for connecting a tool requiring amplified power output from the generator 10 (such as a plasma generating tool) and one or more control circuit interfaces 60 allowing connection to a user control device (such as a computer) for user input of settings to the low-power circuit 24. The back panel 48 further includes an AC input socket 56 into which an AC input plug is connected for powering the generator 10 via the power pack 68 (see FIG. 5) housed within the generator 10.

With reference to FIG. 4, in accordance with various embodiments, the fan 34 is operable, when operated in one direction, so as to suck cooling air into the housing 18 through the cooling air outlet 32 and into the duct 50. The cooling air passes through the lower cross-sectional area region 38 over the shallower cooling fins 66 and then is directed by the kink 40 into the higher cross-sectional area region 36 so as to pass over the deeper cooling fins 64 and out of the housing 18 through the fan inlet/outlet 30.

Referring again to FIG. 4, in accordance with aspects of the present disclosure, the air flow guidance plate 16 includes a distribution of cooling air holes 28 allowing cooling air passing through the duct 50 to create a venturi effect to pull cooling air through the air flow guidance plate 16 from the low-power compartment 22 into the cooling air duct 50, particularly to be directed over the low-power circuit 24, thereby cooling the low-power circuit 24. The number and size of the cooling air holes in the distribution of cooling air holes 28 allow, in part, a fraction of the cooling air that passes from the low-power compartment to be determined. Preferably, there are between 10 and 80 such holes or between 20 and 60 such holes or between 30 and 50 such holes, as shown in FIG. 8. Preferably, there are at least 10 such holes or at least 20 such holes. Exemplary size ranges for the holes are between 1 and 10 mm in diameter such as about 5 mm.

In the exemplary embodiment shown in FIG. 4, an underside of the shallower cooling fins 66 are spaced from a top side of the air flow guidance plate 18 whereas the underside of the deeper cooling fins 64 are located in closer proximity with the top side of the air flow guidance plate 16. This spacing facilitates the cooling air passing through the reduced cross-sectional area region 38 to pull cooling air through the distribution of cooling air holes 28 by venturi effect.

Figure 6:
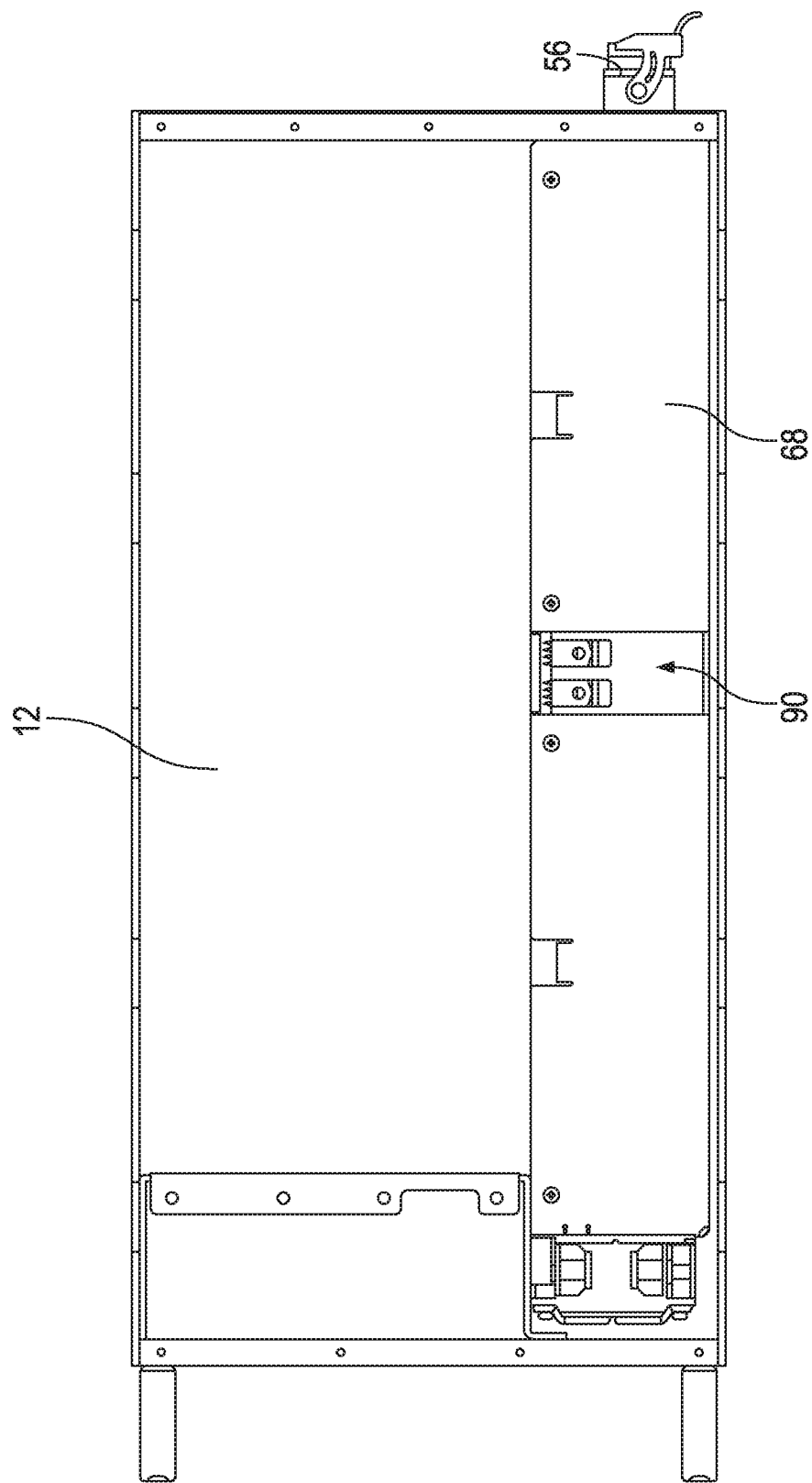
FIG. 6 is another view of the cross section of the generator of FIG. 1, showing positioning of DC connectors on the power pack of the generator.

FIG. 6 illustrates a further aspect of the present disclosure including DC connectors 90 between the power pack 68 and the high-power circuit 12 (shown in block form). Preferably, AC power is received at the AC input socket 56 and is converted to DC power (amongst other functions performed by the power pack 68) by an analog to digital power converter of the power pack 68. DC power is supplied through the DC connectors 90 of the power pack 68 to the high-power circuit 12. The DC power is routed to the at least one transistor 26 via at least one circuit trace. In the generator 10 disclosed herein, the DC connectors are located in a middle region (e.g. a mid-point) between opposed longitudinal ends of the power pack 68. The DC power is controlled via the low-power circuit 24, as are control signals supplied to the pre-amplifier of the high-power circuit 12, thereby controlling DC input and gate signals of the at least one transistor 26 to allow control of power output by the generator 10. Aspects of the present disclosure thus provide a compact generator 10 allowing EMI shielding between a low-power compartment 22 and a high-power compartment 20 and allowing EMI shielding between inside and outside the housing 18. Aspects of the present disclosure allow for efficient cooling of high- and low-power components using a single fan 34.

In accordance with various embodiments, the generators and power amplifiers described herein are useful to power plasma tools.

While at least one exemplary aspect has been presented in the foregoing detailed description of the invention, it should be appreciated that a vast number of variations exist. It should also be appreciated that the exemplary aspect or exemplary aspects are only examples, and are not intended to limit the scope, applicability, or configuration of the invention in any way. Rather, the foregoing detailed description will provide those skilled in the art with a convenient road map for implementing an exemplary aspect of the invention. It being understood that various changes may be made in the function and arrangement of elements described in an exemplary aspect without departing from the scope of the invention as set forth in the appended claims.

FURTHER ASPECTS OF THE PRESENT INVENTION CAN BE DEFINED AS FOLLOWS

Aspect 1: A generator, comprising:
 a housing;
 a high-power circuit including a power amplifier;
 a low-power circuit; and
 a cooling air duct dividing the housing into at least two compartments including a high-power compartment and a low-power compartment, wherein the high-power circuit is disposed within the high-power compartment and the low-power circuit is disposed within the low-power compartment.

Aspect 2: The generator of aspect 1, wherein the low-power circuit comprises a control circuit for generating control signals for controlling at least one transistor of the power amplifier.

Aspect 3: The generator of aspect 2, wherein at least one control signals is a gate control signal.

Aspect 4: The generator of aspect 1, wherein the cooling air duct comprises an air flow guidance plate comprising a distribution of cooling air holes allowing cooling air to pass between the low-power compartment and the cooling air duct.

Aspect 5: The generator of aspect 1, comprising a fan inlet at one end of the housing and a cooling air outlet at an opposed end of the housing, wherein cooling air passes from the fan inlet to the cooling air outlet within the cooling air duct.

Aspect 6: The generator of aspect 5, wherein the air flow guidance plate comprises a distribution of cooling air holes allowing cooling air to pass between the low-power compartment and the cooling air duct to cool the low-power circuit.

Aspect 7: The generator of aspect 6, wherein the air flow guidance plate is shaped to reduce a cross-sectional area of the cooling air duct adjacent to the low power circuit, thereby forming a reduced cross-sectional area region of the cooling air duct, wherein the distribution of cooling air holes is located in the reduced cross-sectional area region.

Aspect 8: The generator of aspect 6, wherein the cooling air holes are configured such that air passes therethrough by venturi effect.

Aspect 9: The generator of aspect 1, comprising a heat sink upon which the high-power circuit is disposed, wherein the heat sink includes cooling fins.

Aspect 10: The generator of aspect 9, wherein the heat sink is made of metal.

Aspect 11: The generator of aspect 9, wherein the generator includes a front panel and a back panel and the cooling fins extend along the heat sink from the front panel to the back panel.

Aspect 12: The generator of aspect 9, comprising a fan inlet/outlet at one end of the housing and a cooling air inlet/outlet at an opposed end of the housing, such that cooling air passes from the fan inlet/outlet to the cooling air inlet/outlet within the cooling air duct over the cooling fins.

Aspect 13: The generator of aspect 12, such that cooling air passes from the fan inlet/outlet to the cooling air inlet/outlet along the air flow guidance plate and cooling air joins the air flow in the cooling duct by venturi effect through a distribution of cooling air holes passing through the air flow guidance plate.

Aspect 14: The generator of aspect 1, wherein the housing is rectangular cuboid shaped having four relatively large faces and two relatively small faces, the housing comprising front and back panels located, respectively, at the two relatively small faces of the housing, wherein the air flow guidance plate extends between the front and back panels and spans, at least partly, two opposed faces of the relatively large faces of the housing.

Aspect 15: The generator of aspect 1, wherein the air flow guidance plate is made of metal.

Aspect 16: The generator of aspect 1, wherein the power amplifier is configured for outputting radiofrequency, RF, power.

Aspect 17: The generator of aspect 1, wherein the power amplifier has an operating frequency range of 100 kHz to 200 MHz.

Aspect 18: The generator of aspect 1, wherein the power amplifier has an output power of at least 100 W.

Aspect 19: The generator of aspect 1, wherein the power amplifier comprises at least two field effect transistors connected in a push-pull arrangement.

Aspect 20: The generator of aspect 1, wherein the low-power circuit comprises a memory and a processor for generating control signals for the power amplifier according to a programmed control scheme stored on the memory.

What is claimed is:

1. A generator, comprising:
a housing;
a high-power circuit including a power amplifier;
a low-power circuit; and
a cooling air duct dividing the housing into at least two compartments including a high-power compartment and a low-power compartment, wherein the high-power circuit is disposed within the high-power compartment and the low-power circuit is disposed within the low-power compartment;
wherein the low-power circuit comprises a control circuit for generating control signals for controlling at least one transistor of the power amplifier; and
wherein the cooling air duct comprises an air flow guidance plate comprising a distribution of cooling air holes allowing cooling air to pass between the low-power compartment and the cooling air duct.

2. The generator of claim 1, wherein at least one control signals is a gate control signal.

3. The generator of claim 1, comprising a fan inlet at one end of the housing and a cooling air outlet at an opposed end of the housing, wherein cooling air passes from the fan inlet to the cooling air outlet within the cooling air duct.

4. The generator of claim 1, wherein the air flow guidance plate is shaped to reduce a cross-sectional area of the cooling air duct adjacent to the low power circuit, thereby forming a reduced cross-sectional area region of the cooling air duct, wherein the distribution of cooling air holes is located in the reduced cross-sectional area region.

5. The generator of claim 1, wherein the cooling air holes are configured such that air passes therethrough by venturi effect.

6. The generator of claim 1, comprising a heat sink upon which the high-power circuit is disposed, wherein the heat sink includes cooling fins.

7. The generator of claim 6, wherein the heat sink is made of metal or wherein the generator includes a front panel and a back panel and the cooling fins extend along the heat sink from the front panel to the back panel.

8. The generator of claim 7, comprising a fan inlet/outlet at one end of the housing and a cooling air inlet/outlet at an opposed end of the housing, such that cooling air passes from the fan inlet/outlet to the cooling air inlet/outlet within the cooling air duct over the cooling fins.

9. The generator of claim 8, such that cooling air passes from the fan inlet/outlet to the cooling air inlet/outlet along an air flow guidance plate and cooling air joins the air flow in the cooling duct by venturi effect through a distribution of cooling air holes passing through the air flow guidance plate.

10. The generator of claim 1, wherein the housing is rectangular cuboid shaped having four relatively large faces and two relatively small faces, the housing comprising front and back panels located, respectively, at the two relatively small faces of the housing, wherein an air flow guidance plate extends between the front and back panels and spans, at least partly, two opposed faces of the relatively large faces of the housing.

11. The generator of claim 1, wherein the air flow guidance plate is made of metal.

12. The generator of claim 1, wherein the power amplifier is configured for outputting radiofrequency, RF, power, wherein the power amplifier preferably has an operating frequency range of 100 kHz to 200 MHz, and/or wherein the power amplifier has an output power of at least 100 W.

13. The generator of claim 1, wherein the power amplifier comprises at least two field effect transistors connected in a push-pull arrangement.

14. The generator of claim 1, wherein the low-power circuit comprises a memory and a processor for generating control signals for the power amplifier according to a programmed control scheme stored on the memory.

* * * * *